(12) United States Patent
Ahn et al.

(10) Patent No.: US 7,890,063 B2
(45) Date of Patent: Feb. 15, 2011

(54) SYSTEMS, METHODS, AND APPARATUSES FOR COMPLEMENTARY METAL OXIDE SEMICONDUCTOR (CMOS) ANTENNA SWITCHES USING BODY SWITCHING IN MULTISTACKING STRUCTURE

(75) Inventors: Minsik Ahn, Atlanta, GA (US);
Chang-Ho Lee, Marietta, GA (US);
Changhyuk Cho, Roswell, GA (US);
Jaejoon Chang, Duluth, GA (US);
Wangmyong Woo, Cumming, GA (US);
Haksun Kim, Daejeon (KR); Joy Laskar, Marietta, GA (US)

(73) Assignees: Samsung Electro-Mechanics (KR);
Georgia Tech Research Corporation, Atlanta, GA (US)

( * ) Notice: Subject to any disclaimer, the term of this patent is extended or adjusted under 35 U.S.C. 154(b) by 452 days.

(21) Appl. No.: 11/857,322

(22) Filed: Sep. 18, 2007

(65) Prior Publication Data

US 2008/0079653 A1    Apr. 3, 2008

Related U.S. Application Data

(60) Provisional application No. 60/827,931, filed on Oct. 3, 2006.

(51) Int. Cl.
*H04B 1/44* (2006.01)
(52) U.S. Cl. ...................................... 455/78
(58) Field of Classification Search ............ 455/78, 455/63.3, 82, 550.1, 552.1, 556.2; 257/212, 257/213
See application file for complete search history.

(56) References Cited

U.S. PATENT DOCUMENTS 5,461,265 A    10/1995    Kunihisa et al.

(Continued)

FOREIGN PATENT DOCUMENTS

CN    1689241 A    10/2005

(Continued)

OTHER PUBLICATIONS

United Kingdom International Search Report for GB0719303.0 dated Jan. 24, 2008.

(Continued)

*Primary Examiner*—Eugene Yun
(74) *Attorney, Agent, or Firm*—Sutherland Asbill & Brennan LLP

(57) ABSTRACT

Embodiments of the invention may provide for a CMOS antenna switch, which may be referred to as a CMOS SP4T switch. The CMOS antenna switch may operate at a plurality of frequencies, perhaps around 900 MHz and 1.9 GHz according to an embodiment of the invention. The CMOS antenna switch may include both a receiver switch and a transmit switch. The receiver switch may utilize a multi-stack transistor with body substrate tuning to block high power signals from the transmit path as well as to maintain low insertion loss at the receiver path. On the other hand, in the transmit switch, a body substrate tuning technique may be applied to maintain high power delivery to the antenna. Example embodiments of the CMOS antenna switch may provide for 31 dBm P 1 dB at both bands (e.g., 900 MHz and 1.8 GHz). In addition, a 0.9 dB and −1.1 dB insertion loss at 900 MHz and 1.9 GHz, respectively, may be obtained according to example embodiments of the invention.

18 Claims, 10 Drawing Sheets

U.S. PATENT DOCUMENTS

| | | | |
|---|---|---|---|
| 5,617,055 | A | 4/1997 | Confalonieri et al. |
| 5,818,099 | A | 10/1998 | Bourgharz |
| 6,094,088 | A | 7/2000 | Yano |
| 6,396,325 | B2 | 5/2002 | Goodell |
| 6,788,957 | B1 | 9/2004 | Recouly et al. |
| 6,836,172 | B2 | 12/2004 | Okashita |
| 6,882,829 | B2 * | 4/2005 | Mostov et al. .......... 455/83 |
| 7,092,677 | B1 | 8/2006 | Zhang et al. |
| 7,233,775 | B2 * | 6/2007 | De Graauw .......... 455/78 |
| 7,659,770 | B2 | 2/2010 | Teraguchi et al. |
| 2003/0090313 | A1 | 5/2003 | Burgener et al. |
| 2004/0214535 | A1 | 10/2004 | Khorram |
| 2006/0119451 | A1 | 6/2006 | Chen |
| 2006/0141943 | A1 | 6/2006 | De Graauw |
| 2006/0194558 | A1 | 8/2006 | Kelly |
| 2006/0199563 | A1 | 9/2006 | Kelly et al. |
| 2006/0252394 | A1 | 11/2006 | Suwa et al. |
| 2007/0049237 | A1 | 3/2007 | Miura et al. |
| 2008/0079653 | A1 | 4/2008 | Ahn et al. |
| 2008/0129642 | A1 | 6/2008 | Ahn et al. |
| 2008/0247338 | A1 | 10/2008 | Kim et al. |
| 2010/0001351 | A1 | 1/2010 | Zhang et al. |

FOREIGN PATENT DOCUMENTS

| | | | |
|---|---|---|---|
| GB | 2442848 | A | 4/2008 |
| JP | 08237166 | A | 9/1996 |
| WO | 9508868 | A1 | 3/1995 |

OTHER PUBLICATIONS

Mei-Chao Yeh, et al., "Design and Analysis for a Miniature CMOS SPDT Switch Using Body-Floating Technique to Improve Power Performance." IEEE Transactions on Microwave Theory and Techniques, Jan. 2006: vol. 54, p. 31-39.

Office Action dated Nov. 11, 2008 for German Patent Application No. 102007046883.2.

Amendment to UK Search Report for Application No. GB0719303.0 dated Feb. 29, 2008.

Office Action mailed on Jul. 23, 2009 for Korean Patent Application No. 10-2007-0099372.

"0.13 μm CMOS SOI SP6T Antenna Switch for Multi-Standard handsets," Dig. SiRF, pp. 58-61, Jan. 2006.

United Kingdom International Search Report for GB0710606.5, dated Sep. 27, 2007.

Minsik Ahn et al. "A high-power CMOS switch using a novel adaptive voltage swing distribution method in multistack FETs", IEEE Trans. on Microwave Theory and Techniques, vol. 56, No. 4, pp. 849-858, Apr. 2008.

Mei-Chao Yeh et al. "Design and analysis for a miniature CMOS SPDT switch using body-floating technique to improve performance", IEEE Transactions on Microwave Theory and Techniques, vol. 54 No. 1, pp. 31-39, Jan. 2006.

Mei-Chao Yeh, et al. "A Miniature Low-Insertion-Loss, High-Power CMOS SPDT Switch Using Floating-Body Technique for 2.4- and 5.8- GHz Applications." IEEE Xplore. May 7, 2009, p. 451-454.

Feng-Jung Huang et al. "Single-pole double-throw CMOS switches for 900-MHz and 2.4-GHz applications on p- silicon substrates", IEEE Journal of Solid-State Circuits, vol. 39, No. 1, pp. 35- 41, Jan. 2004.

Niranjan A. Talwalkar, et al. "Integrated CMOS Transmit-Receive Switch Using LC-Tuned Substrate Bias for 2.4- and 5.2-GHz Applications." IEEE Xplore. May 8, 2009, p. 863-870.

Karl Goser, Großintegrationstechnik - Teil 1: Vom Transistor zur Grundschaltung. Heidelberg: Hüthig, 1990, S. 99-10. ISBN: 3-7785-1615-9.

Combined Search and Examination Report for GB0816744.7 mailed Jan. 12, 2009.

International Search Report for GB0723464.4 dated Feb. 28, 2008.

Office Action dated Jan. 19, 2010 for German Patent Application No. 102008046778.2.

Notice of Allowance dated Mar. 10, 2010 for Application No. 11/855,950.

Office Action dated Jan. 15, 2010 for German Patent Application No. 102007057656.2.

Office Action for Chinese Patent Application No. 200710163832.5 dated May 11, 2010.

Notice of Allowance dated Jul. 27, 2010 for U.S. Appl. No. 11/943,378.

* cited by examiner

SYSTEMS, METHODS, AND APPARATUSES FOR COMPLEMENTARY METAL OXIDE SEMICONDUCTOR (CMOS) ANTENNA SWITCHES USING BODY SWITCHING IN MULTISTACKING STRUCTURE

RELATED APPLICATION

The present application claims priority to U.S. Provisional Application Ser. No. 60/827,931, filed on Oct. 3, 2006, and entitled "Complementary Metal Oxide Semiconductor (CMOS) Antenna Switches using Body Switching in Multistacking Structure," which is hereby incorporated in its entirety by reference.

FIELD OF THE INVENTION

The invention relates generally to antenna switches, and more particularly, to CMOS (complementary metal oxide semiconductor) antenna switches.

BACKGROUND OF THE INVENTION

In the past decade, the wireless communication industry has experienced explosive growth, which has in turn accelerated the development of integrated circuit (IC) industry. In particular, in the IC industry, many mobile application systems like low noise amplifiers (LNAs), mixers, and voltage-controlled oscillators (VCOs) have been integrated into CMOS technology. Two significant mobile application components—power amplifiers (PAs) and radio frequency (RF) switches—have not yet been commercially integrated into CMOS technology.

However, IC industry research is quickly moving towards power amplifier integrated into CMOS technology. For example, current research indicates that a CMOS power amplifier may be feasible and be able to provide a significant amount of power, perhaps up to 2 W, for mobile communications. Accordingly, when the power amplifier becomes integrated into CMOS technology, there will be a need for an RF switch integrated into CMOS technology.

However, current CMOS technology presents a variety of difficulties for its application to RF switches. In particular, CMOS material characteristics, including lossy substrates due to low mobility of electrons and low breakdown voltages due to p-n junction, hot carrier effects, have prevented CMOS technology from being used for RF switches that require multi-band operation, high power levels, and/or integration with other devices and circuits.

BRIEF SUMMARY OF THE INVENTION

Embodiments of the invention may provide for CMOS RF switches, which may be referred to as a CMOS SP4T switch. According to an embodiment of the invention, the CMOS RF switch may be fabricated using a 0.18 um process, although other processes may be utilized without departing from the invention. In order to provide high power handling capability in a multi-band operation (e.g., about 900 MHz and 1.9 GHz) of the CMOS RF switch, an multi-stacked transistors with substrate body switching may be applied to the receiver switch. According to an embodiment of the invention, the CMOS RF switch may provide higher blocking capability at the transmission (Tx) mode as well as low insertion loss at the reception (Rx) mode at multi-band (e.g., 900 MHz and 1.9 GHz).

According to an example embodiment of the invention, there is a CMOS antenna switch. The CMOS antenna switch may include an antenna operative at a plurality of radio frequency (RF) bands, a transmit switch in communication with the antenna, and a receiver switch in communication with the antenna, where the receiver switch may include a plurality of transistors, including a first transistor having a body substrate, whereithe body substrate is selectively connectable between a resistance and ground.

According to another example embodiment of the invention, there is a method for providing a CMOS antenna switch. The method may include providing an antenna operative at a plurality of radio frequency (RF) bands, electrically connecting a transmit switch to the antenna, and electrically connecting a receiver switch to the antenna, where the receiver switch may include a plurality of transistors, including a first transistor having a body substrate, where the body substrate is selectively connectable between a resistance and ground.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 1A, 1B, and 1C illustrate simplified operations of a receiver switch in accordance with an example embodiment of the invention.

DETAILED DESCRIPTION OF THE INVENTION

The invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for CMOS RF antenna switches, which may also be referred to as SP4T CMOS switches. The CMOS RF antenna switches in accordance with embodiments of the invention may provide for one or more of multi-band operation, high power level handling, and integration with other devices and circuits. Generally, the CMOS RF antenna switch may include a receiver switch and a transmit switch. The receiver switch may utilize one or more switching substrate bodies, as will be described in further detail below. In addition, the transmit switch may utilize a substrate body tuning technique, as will also be described in further detail below.

I. Example Embodiment of a CMOS RF Antenna Switch

A CMOS RF antenna switch in accordance with an embodiment of the invention will be now be described with reference to FIGS. 1A-1C. It will be appreciated that while a particular embodiment of the CMOS RF antenna switch is illustrated in FIGS. 1A-1C, other variations of the illustrated CMOS RF antenna switch are available without departing from an embodiment of the invention.

Figure 1A:
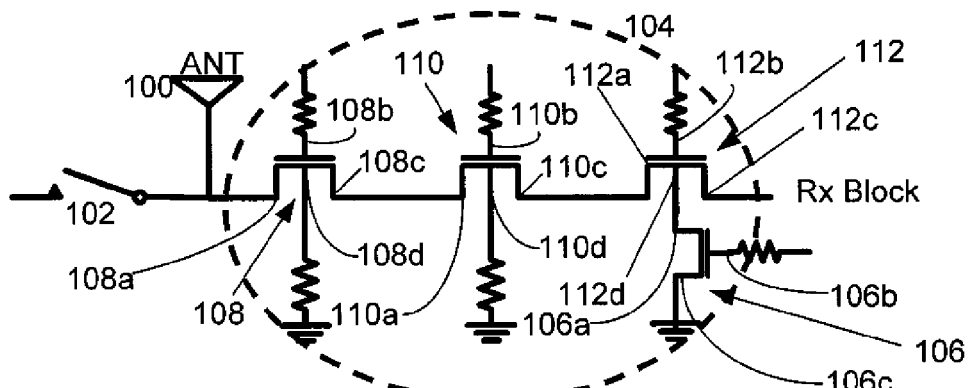
Figure 1B:
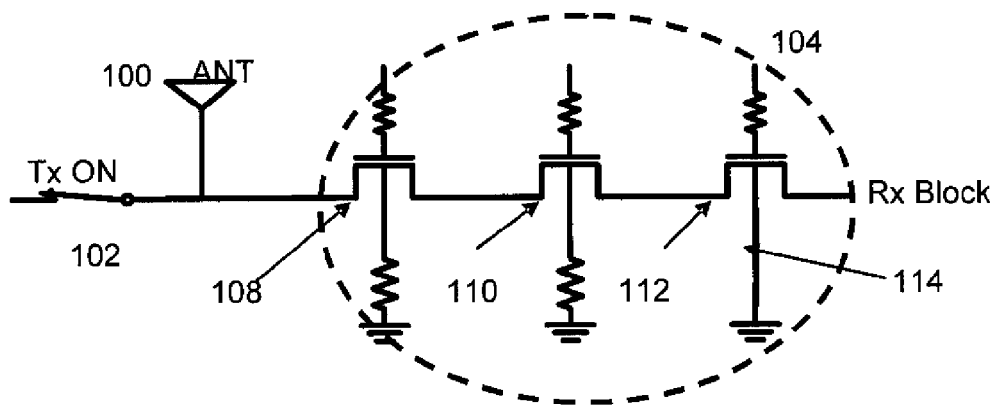
Figure 1C:
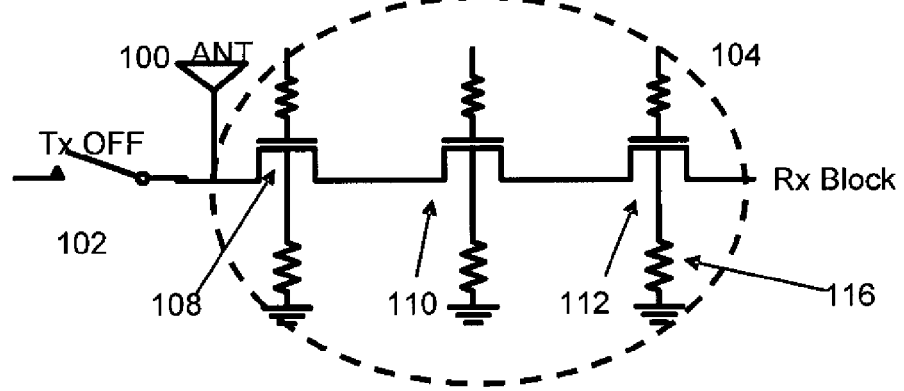

FIG. 1A illustrates a simplified CMOS RF antenna switch and its operation in accordance with an example embodiment of the invention. The CMOS RF antenna switch may include a transmit switch 102 and a receiver switch 104, in accordance with an example embodiment of the invention. Additionally, CMOS RF antenna switch may include an antenna 100 that is in communication with at least one of the transmit switch 102 and the receiver switch 104. According to an example embodiment of the invention, the antenna 100 may be a single multi-mode (e.g., RX and TX), multi-band antenna, although a plurality of distinct antennas may be utilized according to other embodiments of the invention. The receiver switch 104 may be comprised of cascaded or stacked transistors 108, 110, 112, and 106, which may be Complementary Metal Oxide Semiconductor (CMOS) transistors, according to an example embodiment of the invention. The transistor 108 may include a source 108a, a gate 108b, a drain 108c, and a body substrate 108d. The transistor 110 may include a source 110a, a gate 110b, a drain 110c, and a body substrate 110d. The transistor 112 may include a source 112a, a gate 112b, a drain 112c, and a body substrate 112d. The transistor 106, may include a source 106a, a gate 106b, a drain 106c, and a body substrate (not shown).

The transistor 108 may have its drain 108c connected to the source 110a of transistor 110. In addition, the transistor 110 may have its drain 110c connected to the source of transistor 112a. The drain 112c of transistor 104 may be connected to the receive (RX) block to processes received signals from the antenna 100. Additionally, the body substrate 112a of the transistor 112 may be connected to the source 106a of the transistor 106. The drain 106c of the transistor 106 may be connected to ground. As will be described in further detail, at least one transistor 106, which may operate as a substrate body switch for transistor 112, may be provided at the substrate body 112d in accordance with an example body switching technique. In particular, the at least one transistor 106 may be switched to an ON state or an OFF state, depending on whether depending on whether a respective transmit (Tx) mode or receive (Rx) mode is in operation. As will be described in further detail below in accordance with an example embodiment of the invention, the receiver switch 104 of FIG. 1A may yield different equivalent circuits depending on whether the receiver switch 104 is in an OFF state, as illustrated in FIG. 1B, or an ON state, as illustrated in FIG. 1C.

A. Transmit (Tx) Mode

FIG. 1B illustrates an equivalent circuit of the receiver switch 104 in an OFF (e.g., disabled, block, etc.) state, according to an example embodiment of the invention. In FIG. 1B, the receiver switch 104 may be placed in the OFF state in order to provide isolation from the transmit switch 102. With the receiver switch 104 in the OFF state, a transmit signal may be provided from a transmit (Tx) block to the antenna 100. As shown in FIG. 1B, when the receiver switch 104 is in an OFF state, the stacked transistors 108, 110, 112 may then be placed in an OFF state (e.g., opened), thereby providing a higher impedance. The stacked transistor 106 may placed in an ON state 114 (e.g., closed), thereby shorting the substrate body 112d of transistor 112 to ground, and reducing the signal paths for leakage current to travel from source 112a to drain 112c.

In the configuration of FIG. 1B, the power of the transmit (Tx) signal may be maximized (and maximizing the power handling capability of the Tx block). The power handling capability of the transmit switch 102 may be determined by controlling leakage current directed towards the OFF-state receiver switch 104 as well as the source-to-drain breakdown voltage of cascaded switches 108, 110, and 112 of the receiver switch 104. Thus, the maximum transmit power of the transmit switch 102 may be dependent upon the characteristics of the receiver switch 104.

It will be appreciated that in order to increase the power handling capability of the Tx switch 102, the number of multi-stacked transistors 108, 110, 112 may be increased to reduce the breakdown burden of each transistor 108, 110, 112. For example, more than three transistors 108, 110, and 112 may be cascaded, according to another embodiment of the invention. Furthermore, it will be appreciated that the last transistor 112 from the antenna 112 can control leakage current at the receiver switch 104. If the leakage current toward OFF-state switches 108, 110, and 112 in the Rx path is minimized, then maximum power may be delivered from the Tx block to the antenna 100. As described above, the body switching transistor 106 that is connected between ground and the body substrate 112d of transistor 112 may be used to control leakage current at the receiver switch 104. More particularly, by placing the body switching transistor 106 in the ON state 114, the substrate body 112d of the last transistor 112 from the antenna 100 to the Rx block can be grounded, thereby reducing the signal paths for leakage current to travel from source 112a to drain 112c.

B. Receive (Rx) Mode

FIG. 1C illustrates an equivalent circuit of the receiver switch 104 in an ON (e.g., enable, receive, etc.) state, according to an example embodiment of the invention. In FIG. 11C, the receiver switch 104 may be placed in the ON position in order for the receive (RX) block to receive a signal from the antenna 100. With the receiver switch 104 in the ON state, the transmit switch 102 may be placed in the OFF (e.g., disabled, block) state to isolate the transmit switch 102 from the receiver switch 104. As shown in FIG. 1C, when the receiver switch 104 is in an ON state, the stacked transistor 106 may be placed in an OFF state 116, thereby providing an equivalent resistor between the body substrate 112d of transistor 112 and ground (i.e., body floating). In this way, the insertion loss at the receive (Rx) path from the antenna 100 to the RX block may be minimized.

II. Example Embodiment of a Multi-Band RF CMOS Switch

Figure 2A:
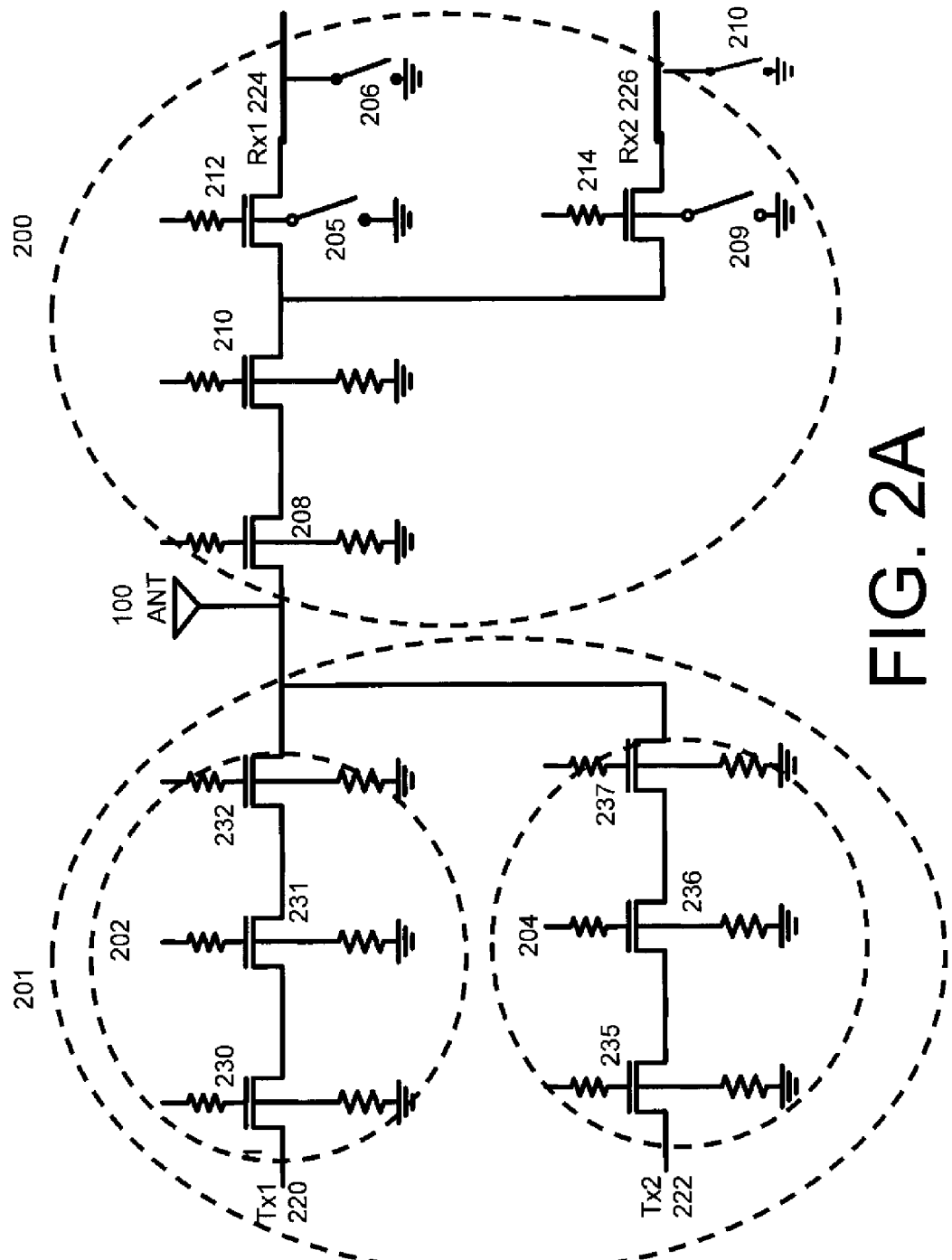
FIGS. 2A and 2B illustrates a example CMOS switch using a multi-stacked switch at transmit (Tx) mode, in accordance with an example embodiment of the invention.

A multi-band RF CMOS switch in accordance with an example embodiment will now be discussed with reference to FIGS. 2-5. FIG. 2A illustrates an example operation of a CMOS RF antenna switch at multi-band in transmit (Tx) mode, according to an example embodiment of the invention. In particular, the CMOS RF antenna switch of FIG. 2A includes an antenna 100 in communication with a transmit switch 201 and a receiver switch 200. The transmit switch 201 may include a first transmit signal path Tx1 220 that is controlled by multi-stacked transistor switches 202 and a second transmit signal path Tx2 222 that is controlled by multi-stacked transistor switches 204, according to an example embodiment of the invention. Transistor switches 202 and 204 may be connected in parallel to the antenna 100. Switches 202 may comprise CMOS transistor switches 230, 231, and 232 that are cascaded or stacked from source to drain. For example, the source of transistor switch 230 may be connected to the drain of transistor switch 231. Likewise, the source of transistor switch 231 may be connected to the drain of transistor switch 232. Similarly, switches 204 may comprise CMOS transistor switches 235, 236, and 236 that are cascaded or stacked from source to drain. For example, the source of transistor switch 235 may be connected to the drain of transistor switch 236. Likewise, the source of transistor switch 236 may be connected to the drain of transistor switch 237.

Still referring to FIG. 2A, the receiver switch 200 may include a first receive signal path Rx1 224 and a second receive signal path Rx2 226 that are controlled by a plurality of transistor switches, including one or more of transistor switches 208, 210, 212, 205, 206, 214, 209, 210, according to an example embodiment of the invention. One or more of transistor switches 208, 2110, 212, 205, 206, 214, 209, 210 may comprise CMOS transistor switches, according to an example embodiment of the invention. Switch 205 may be operative to selectively connect the body substrate of transistor switch 212 between ground and a resistor, such that transistor switch 212 is either body-grounded or body-floating, according to an example embodiment of the invention. Likewise, the switch 209 may be operative to selectively connect the body substrate of transistor switch 214 between ground a resistor, such that transistor switch 214 is either body-grounded or body-floating, according to an example embodiment of the invention.

A. Transmit (Tx) Mode

Figure 2B:
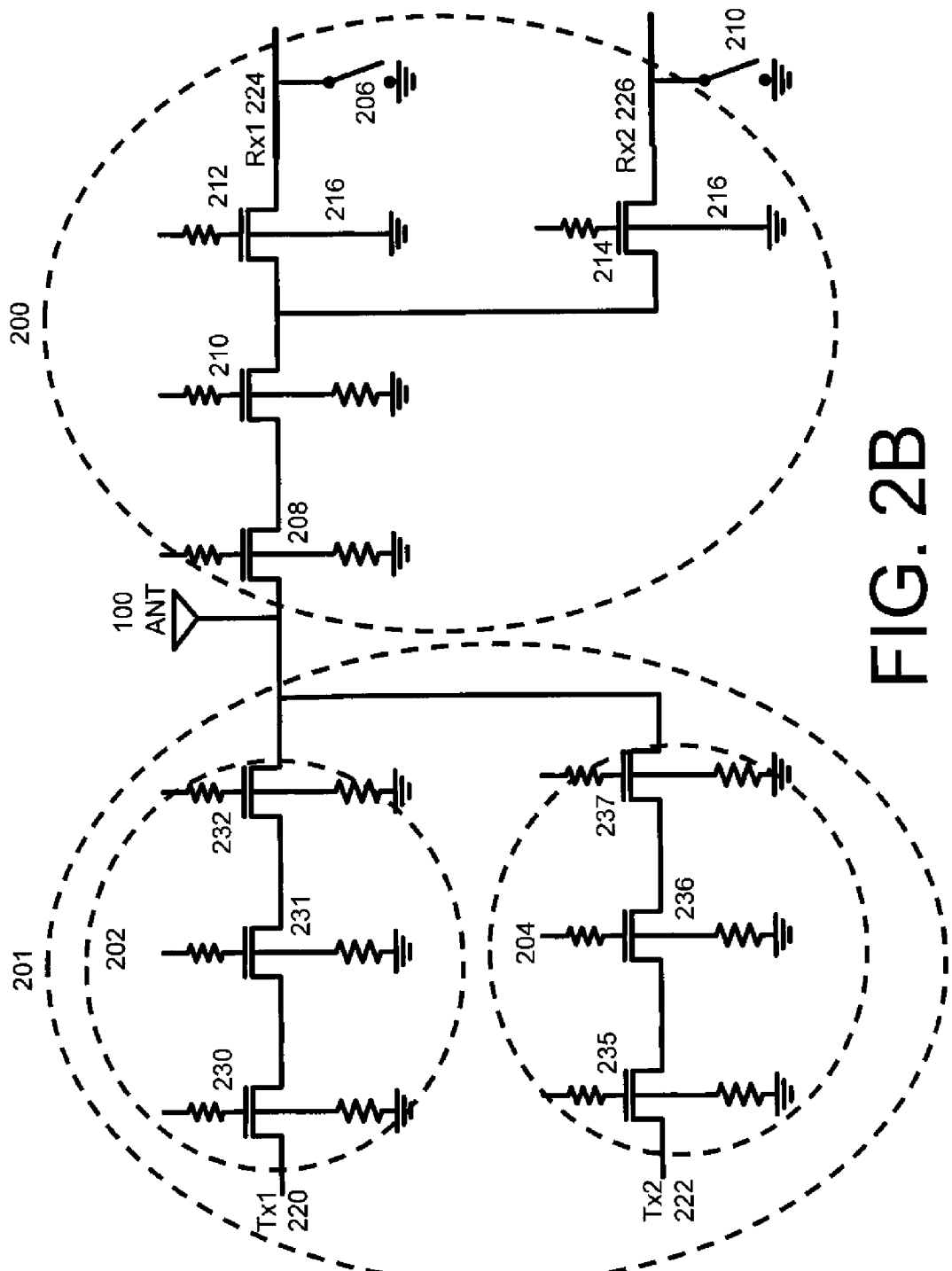

FIG. 2B illustrates the CMOS RF antenna switch of FIG. 2A operating in a transmit (Tx) mode, according to an example embodiment of the invention. More particularly, in FIG. 2B, the CMOS RF antenna switch may be operating in transmit (Tx) mode for the first transmit (Tx) signal path Tx1 220. With this Tx mode configuration, in order to provide the Tx signal path Tx1 220 to the antenna 100, the stacked switches 202 may be closed while the stacked switches 204 may be opened. According to an example embodiment of the invention, stacked switches 202 may be closed by placing transistor switches 230, 231, and 232, respectively, in an ON state. On the other hand, stacked switches 204 may be opened by placing transistor switches 235, 236, and 237, respectively, in an OFF state.

In addition, in a Tx mode configuration, the receiver switch 200 may be placed in an OFF-state, according to an example embodiment of the invention. In particular, to place the receiver switch in the OFF-state, at least one transistor switch 212, 214 may be body-grounded, according to an example embodiment of the invention. More specifically, transistor switches 205 and 209 may be closed (e.g., provided in ON-state 216) in order to short the body substrate of transistors 212, 214 to ground, thereby providing body-grounded switches 212, 214. Further, transistor switches 208, 210, 212, and 214 may be opened to reduce leakage current toward the receive (Rx) path, including the receive paths Rx1 224 and Rx2 226. According to an example embodiment of the invention, transistor switches 208, 210, 212, and 214 may be opened by placing the transistor switches in an OFF-state. In addition, switches 206 and 210 may optionally be closed to bypass leakage signals to ground to protect the low-noise amplifier (LNA) in the receiver (Rx) block.

It will be appreciated that the power handling capability of the transmit switch 201 may be determined by controlling leakage current towards the OFF-state receiver switch 200 and the source-to-drain breakdown voltage of cascaded or stacked switches 208, 210, 212 and 214. In other words, the maximum transmit power of the transmit switch 201 may be dependent upon the characteristics of the receiver switch 200.

It will also be appreciated that variations of FIG. 2B are available without departing from embodiments of the invention. For example, the second signal path Tx2 222 could have been enabled instead of the first signal path Tx1 220 in a transmit (Tx) mode configuration without departing from embodiments of the invention.

Figure 4A:
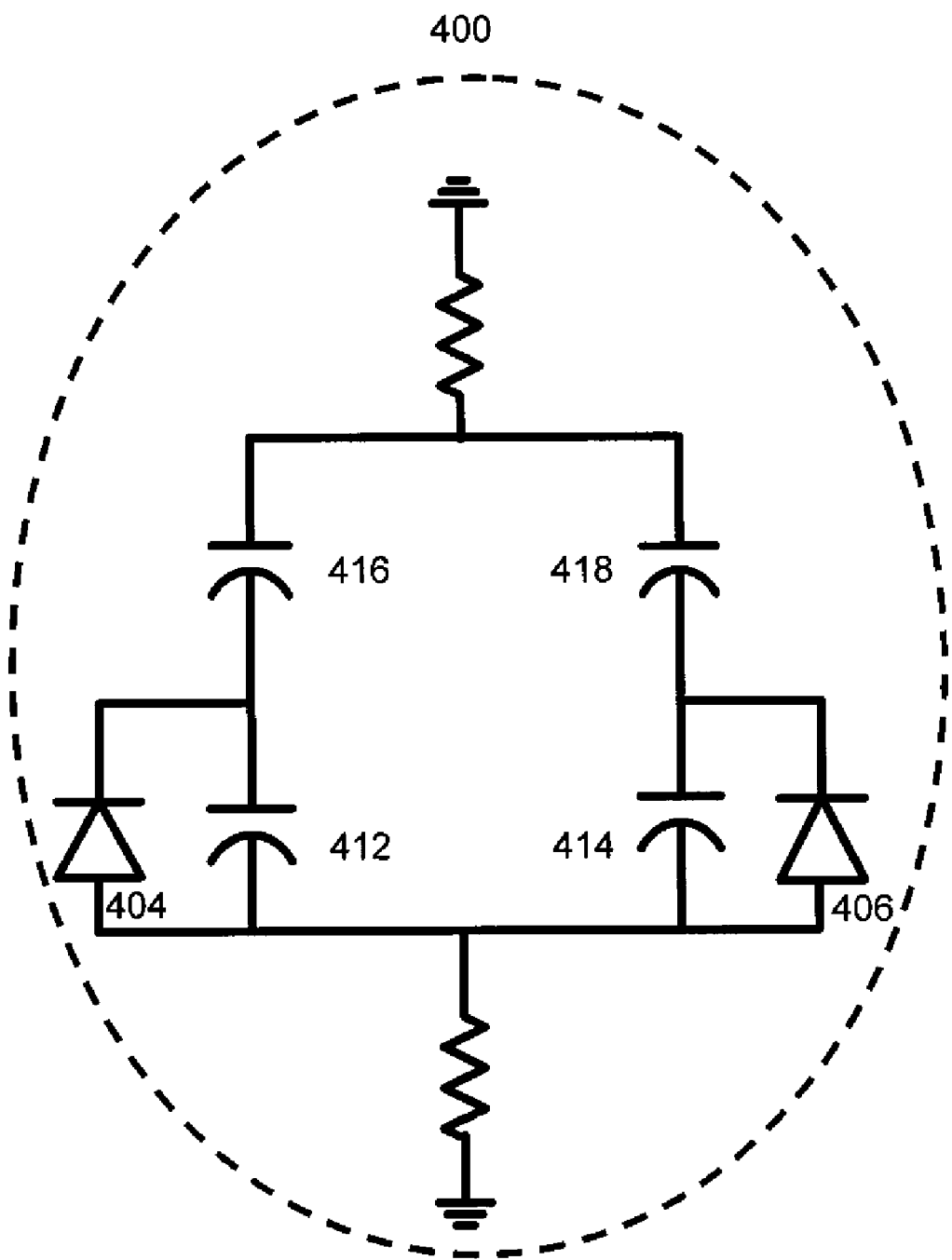
FIG. 4A illustrates an example equivalent lumped model of a body floating transistor at an OFF state, according to an example embodiment of the invention.
Figure 4B:
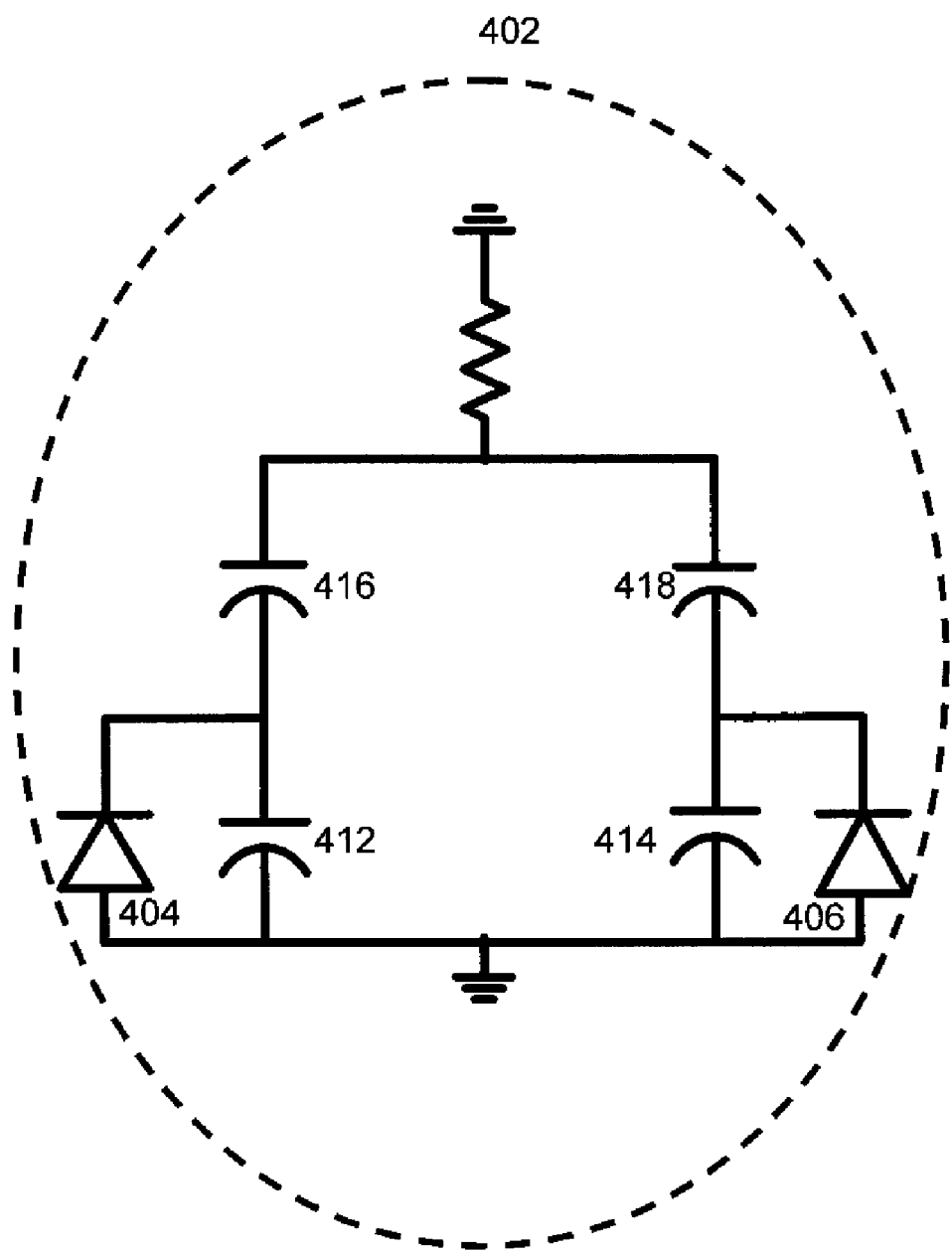
FIG. 4B illustrates an example equivalent lumped model of a body grounded transistor at OFF state, according to an example embodiment of the invention.

Still referring to FIG. 2B, when the receiver switch 200 is in an OFF state, the stacked transistors 208, 210 may be body-floating transistors—that is, their respective substrate bodies may be separated from ground by a resistance—while stacked transistors 212, 214 may be body-grounded transistors, according to an example embodiment of the invention. FIG. 4A illustrates an equivalent lumped model of a body floating transistor at an OFF state 400 such as transistors 208, 210 in FIG. 2B, according to an example embodiment of the invention. FIG. 4B illustrates an equivalent lumped model of a body grounded transistor at an OFF state 402 such as transistors 212, 214 in FIG. 2B, according to an example embodiment of the invention. The equivalent models in FIGS. 4A and 4B may include capacitors 412, 414, 416, 418 as well as p-n junction diodes 404, 406, according to an example embodiment of the invention.

When a voltage swing at the antenna 100 is received by the receiver switch 200, the voltage swing may be divided among stacked transistors 208, 210, 212, and 214. Accordingly, the last transistors 212, 214 may only experience only one third of the full voltage swing at the antenna 100, thereby reducing the possibility of a source-to-drain breakdown voltage occurring for transistors 212, 214. It will be appreciated, however, that the voltage swing at the last transistors 212, 214 may be different, and perhaps smaller, if additional preceding transistors are provided according to other embodiments of the invention to reduce the burden of the stacked transistors 208, 210, 212, 214.

The transistors 208, 210 may be body floating transistors, as illustrated in FIG. 4A. However, in order to reduce the leakage current towards the Rx block and maximize the power handling of the Tx block to the antenna 100, one or both of the body switching transistors 205, 209 can be put in the ON state 216 to connect the substrate bodies of transistors 212, 214 to ground. Accordingly, one or both of the transistors 212, 214 may be a body-grounded transistor, as illustrated in FIG. 4B, which reduces the signal paths for leakage current to travel from the source to drain of respective transistors 212, 214.

When a negative voltage swing is applied to the receiver switch 200, the p-n junction diodes 404, 406 of each transistor 212, 214 may turn on so that leakage current may occur by the current passing through the p-n junction diodes 404, 406. An issue with the p-n junction diodes 404, 406 turning on may be the possible clipping of the negative voltage swing so that power handling capability of the Tx block to the antenna 100 can be limited. However, this leakage current generated by channel formation of the OFF-state transistor 212, 214 may be prevented because the voltage level at the source of transistors 212, 214 may be fixed by the turn on voltage of the p-n junction diode 404. Indeed, the multi-stacked transistors 208, 210, 212, and 214 at OFF-state can divide the voltage swing at antenna 100 port so that the last OFF-state transistors 212, 214, and thus, p-n junction diodes 404, 406, may experience only one third of voltage swing at the antenna 100. Thus, the overall voltage swing at antenna 100 port may not be sufficient to turn the p-n junction diodes 404, 406 on at the last transistor 112.

B. Receive (Rx) Mode

Figure 3:
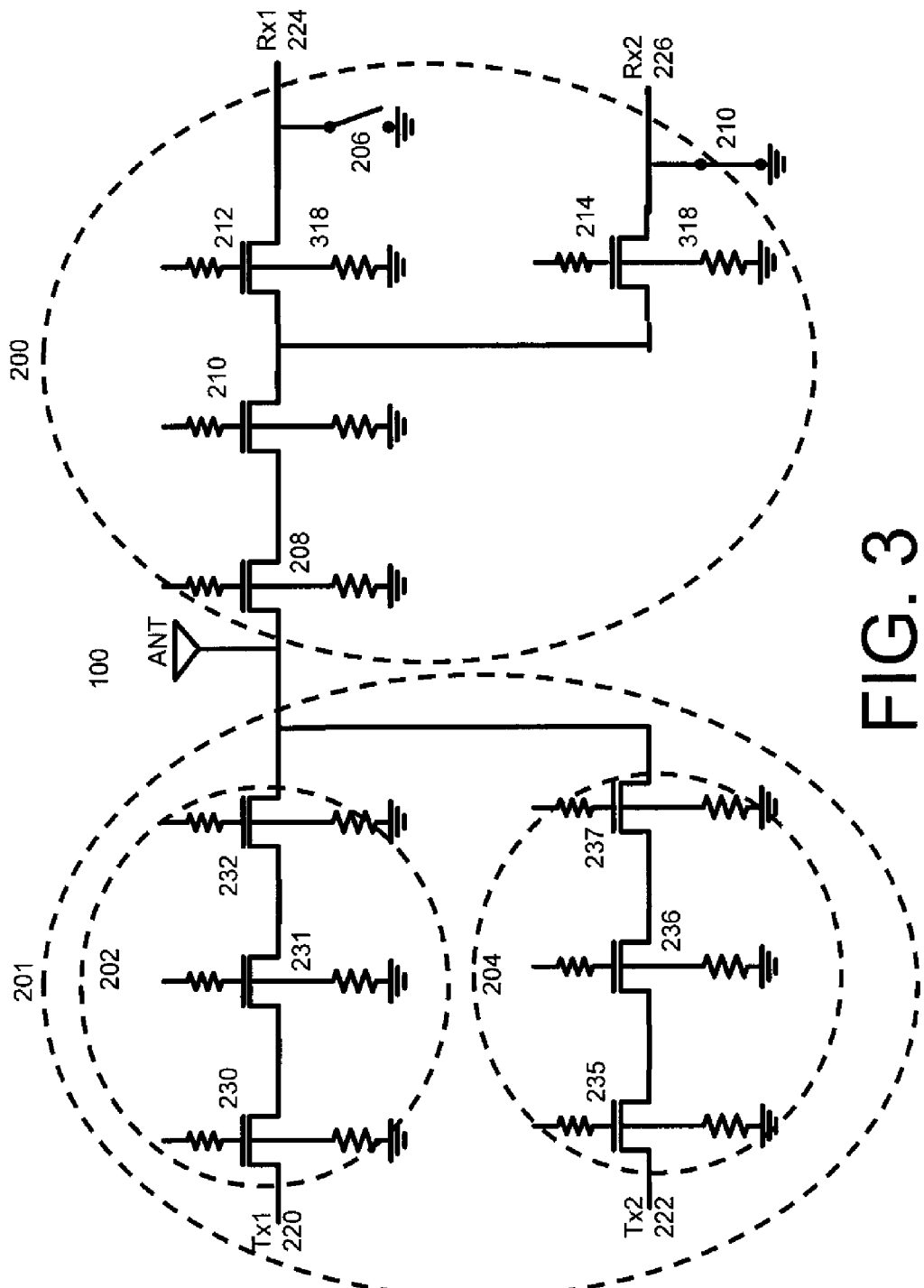
FIG. 3 illustrates an example CMOS switch using a multi-stacked switch at receive (Rx) mode, in accordance with an example embodiment of the invention.

FIG. 3 illustrates the example operation of an RF antenna switch 200 in receive (Rx) mode, according to an example embodiment of the invention. As shown in FIG. 3, both switches 202 and switch 204 of the transmit switch 201 may be opened to provide antenna 100 isolation from transmit signal paths Tx1 220 and Tx2 222, respectively. According to an example embodiment of the invention, switches 220 may be opened by providing transistor switches 230, 231, 232 in an OFF-state. Likewise, switches 204 may be opened by providing transistor switches 235, 236, 237 in an OFF-state, according to an example embodiment of the invention.

To enable the receive signal path Rx1 224, switches 206, 214 may be open (e.g., provided in an OFF-state), while switches 208, 210, 212 may be closed (e.g., provided in an ON-state), according to an example embodiment of the invention. Likewise, transistor switch 205 (and optionally switch 209) may be open (e.g., provided in an OFF-state 318) such that the transistor switch 205 (and switch 209) is a body-floating transistor switch, according to an example embodiment of the invention. Further, to bypass leakage signal to ground to protect the low noise amplifier (LNA) at the receive signal path Rx2 226, the switch 210 may optionally be closed by placing it in an ON-state. One of ordinary skill in the art will recognize that in an alternative embodiment of the invention, signal path Rx2 226 in FIG. 3 could have been enabled instead of signal path Rx1 without departing from embodiments of the invention.

Figure 5:
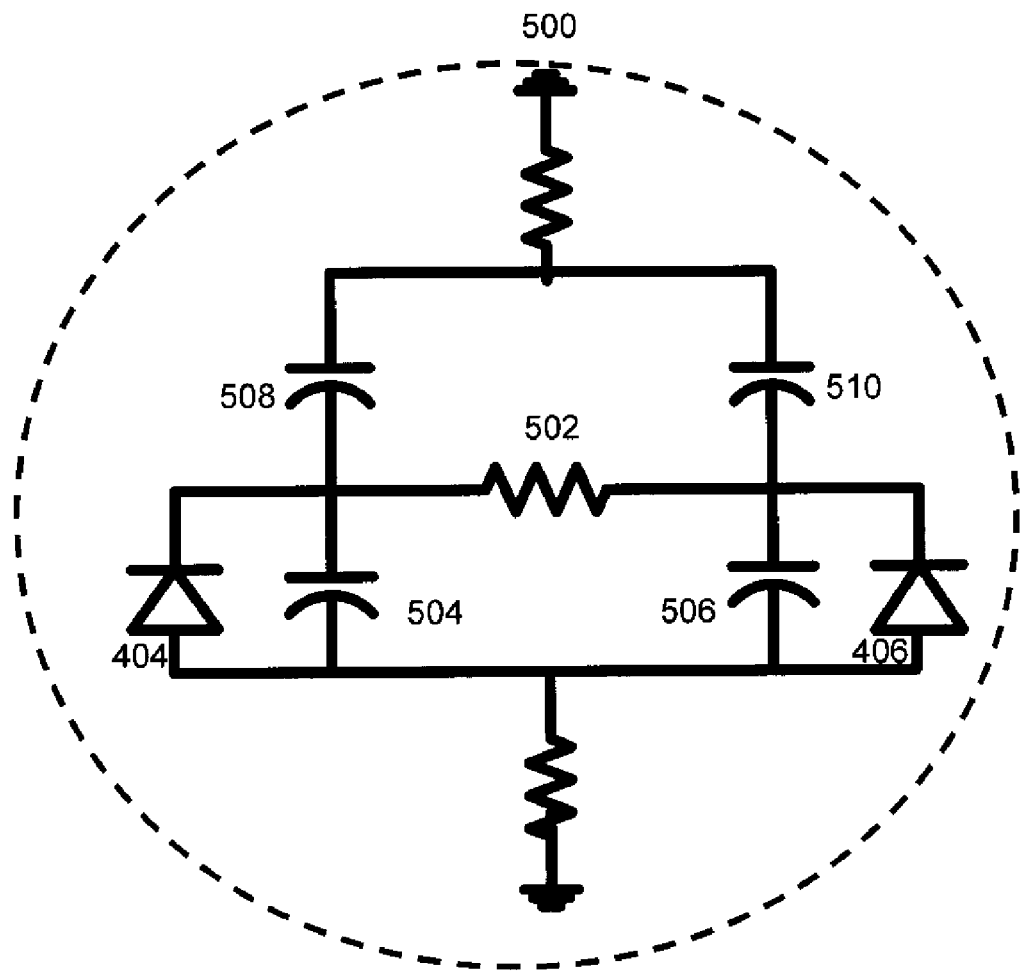
FIG. 5 illustrates a equivalent lumped model of body floating transistor at ON state.

FIG. 5 illustrates an equivalent lumped model of body floating transistor at ON state 500, according to an example embodiment of the invention. As described above, the transistors 205, 209 may be provided in an OFF state 318 to provide body floating transistors 212, 214, as illustrated by the equivalent lumped model of FIG. 5. In FIG. 5, as the size of the transistor 212, 214 increases, the parasitic capacitors 504, 506, 508, 510 may provide another signal path at the ON 500 state. More specifically, the ON state 500 transistor of FIG. 5 may have an ON-resistor 502, a gate-drain capacitor 508 to gate-source capacitor 510, and a drain-body capacitor 504, and body-source capacitor 506 as signal paths. If the body substrate were grounded, then one of these signal paths through capacitors 504, 506 may be lost, thereby increasing the insertion loss. Accordingly, when the receiver switch 200 is in the ON state, the last transistor 212 and/or 214 (depending on whether signal path Rx1 224 or Rx2 226 is utilized) may need to be in a body floating state (e.g., with transistor switch 205, 209 in the OFF state 318) to ensure minimized insertion loss.

III. Detailed Embodiment of a Transmit Switch

A transmit switch such as the transmit switches 102 and 201 will now be described in further detail with reference to FIGS. 6A and 6B. According to an example embodiment of the invention, the transmit switch structure of FIGS. 6A may be utilized for either switch 202 for the first transmit path TX1 220 or switch 204 for the second transmit path TX2 222 according to an example embodiment of the invention. As shown in FIG. 6A, the transmit switch 600 may include CMOS transistors 602, 604, and 606 that are cascaded or stacked from source to drain. By cascading the transistors 602, 604, and 606 from source to drain, the cumulative breakdown voltage can be increased since it is split among the transistors 602, 604, and 606, thereby providing for a higher power blocking capability. Such a high power blocking capability may be necessary, for example, at switches 204 at the second transmit path Tx2 222 when switches 202 at the first transmit path Tx1 220 are closed (e.g., provided in an ON state) to transmit a signal.

However, by cascading or stacking the transistors 602, 604, and 606, the insertion loss of the transmit switch 600 may be increased, according to an embodiment of the invention. Accordingly, as shown in FIG. 6A, a body floating technique, which includes connecting high-value resistors 608, 610, and 612 at the body substrate of respective transistors 602, 604, 606, may be applied to the transmit switch 102 in accordance with an embodiment of the invention. Accordingly, with the use of the resistors 608, 610, 612 may provide for body-floating transistors 602, 604, and 606. With such a body floating technique, the transistors 602, 604, and 606 may use a deep N-well structure of a 0.18-um CMOS process or a similar process, which may be immune to potential latch ups due to connecting high-value resistors 608, 610, 612 at the body substrate of transistors 602, 604, 606. Accordingly, the resistors 608, 610, 612, which may also be referred to as body-floating resistors, may reduce the insertion loss by blocking leakage current from the substrate body to ground.

Figure 6B:
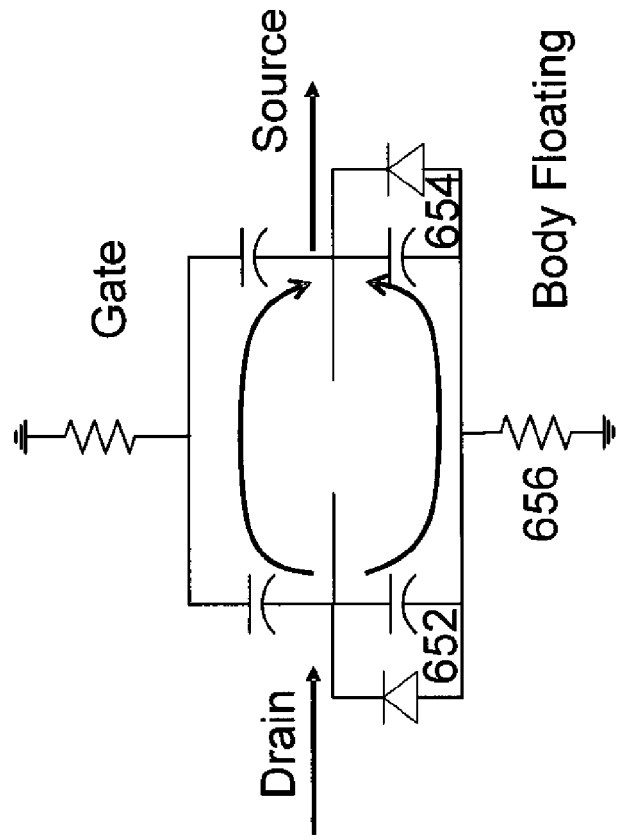
FIG. 6B illustrates a simplified equivalent model of an OFF-state switch using body floating technique switch with signal flow, in accordance with an example embodiment of the invention.
Figure 6A:
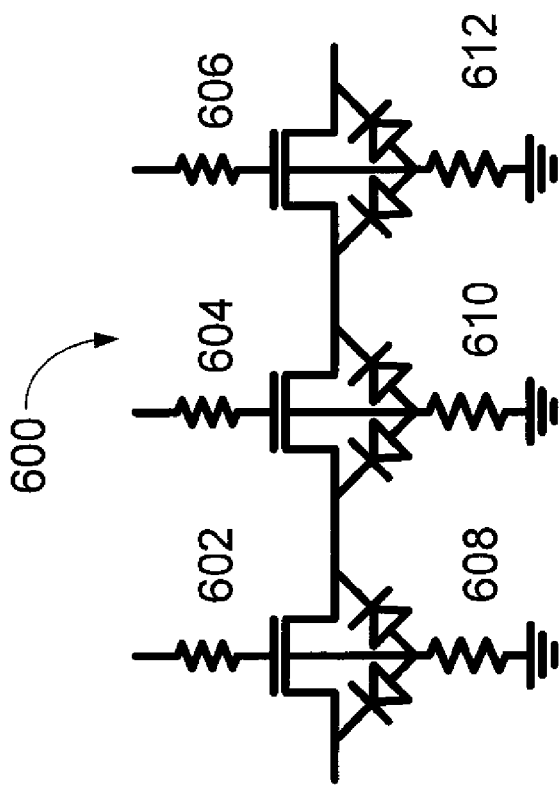
FIG. 6A illustrates a multi-stacked switch at a transmit (Tx) path, in accordance with an example embodiment of the invention.

FIG. 6B illustrates signal flow in an equivalent circuit for a single stage switch at OFF state such as transistors 602, 604, or 606 in FIG. 6A. As the size (e.g., resistance value) of a transistor 608, 610, 612 increases, the parasitic capacitance value becomes high enough so that source-to-body parasitic capacitor 652 and drain-to-body parasitic capacitor 654 with body floating resistor 656 may be used as an additional signal path at the ON state. However, if the body is grounded, one of signal paths in FIG. 6B is bypassed to the ground, which results in degraded insertion loss.

IV. Simulation Results

Figure 7:
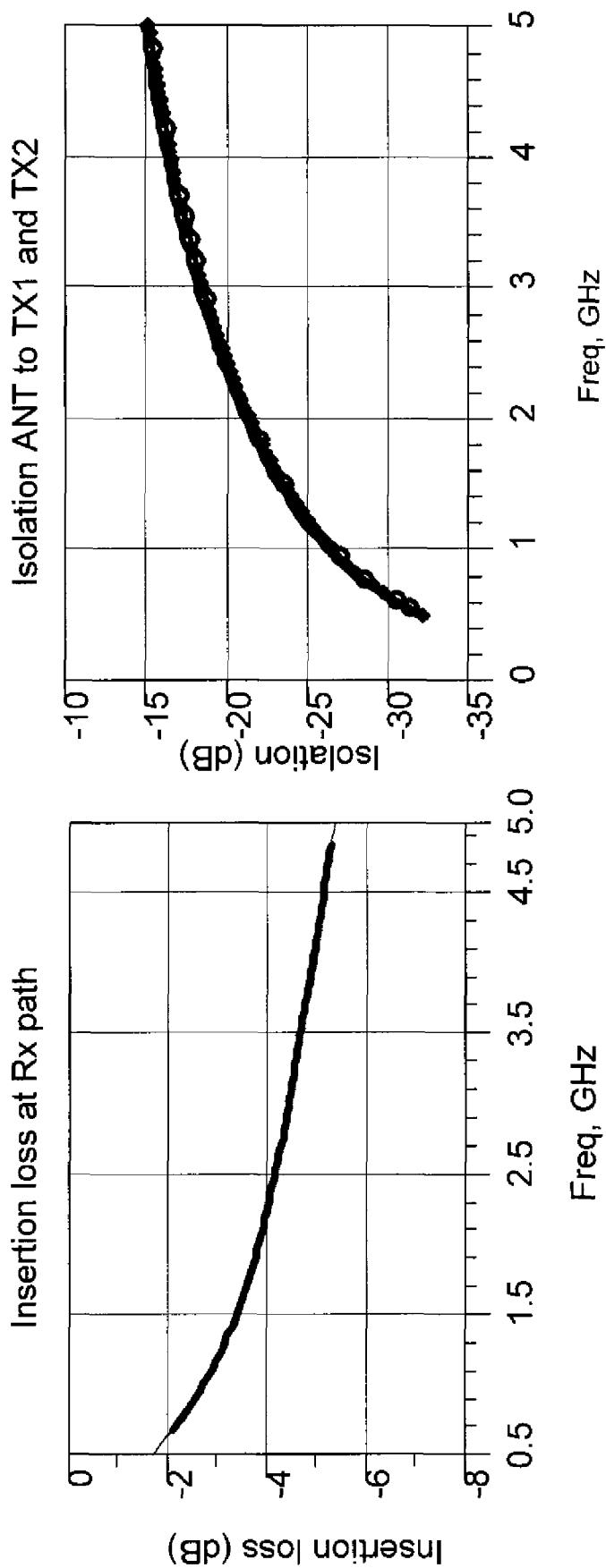
FIG. 7 illustrates example receiver switch simulation results, in accordance with an example embodiment of the invention.

FIG. 7 illustrates example simulation results for the operation of an example multi-band (e.g., 900 MHz, 1.9 GHz) receiver switch in accordance with an embodiment of the invention. These simulation results illustrate the insertion loss and the isolation from the antenna 100 to the transmit paths Tx1 and Tx2. In particular, the solid line represents the first band at 1.9 GHz while the circled line represents the second band at 900 MHz.

Figure 8:
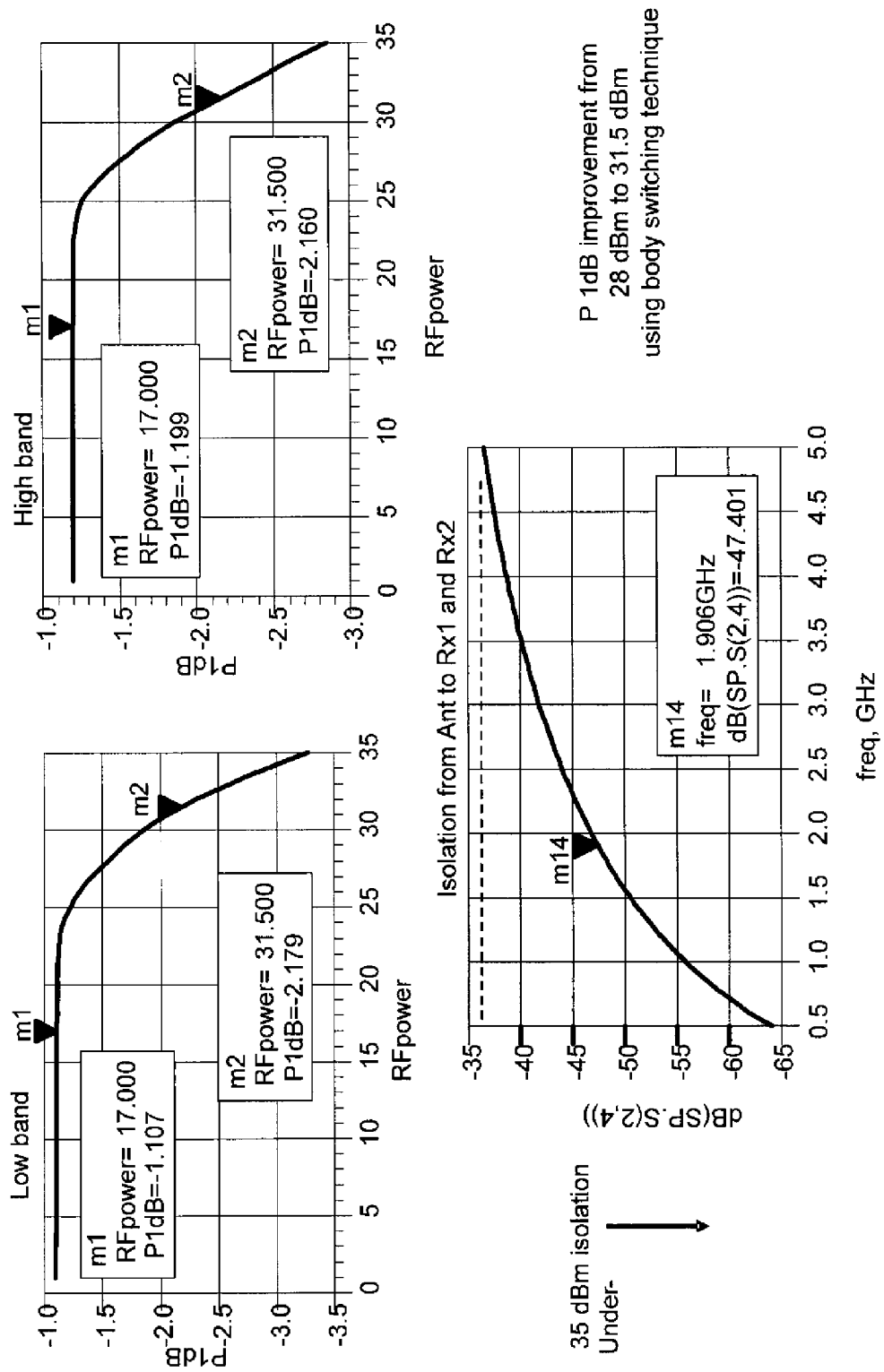
FIG. 8 illustrates example transmit switch simulation results, in accordance with an example embodiment of the invention.

FIG. 8 illustrates example simulation results for the operation of an example multi-band transmit switch in accordance with an example embodiment of the invention. In particular, the simulation results in FIG. 8 illustrate the power handling capability for the transmit switch for low and high bands as well as the isolation from the antenna to the receive (Rx) signal paths Rx1 and Rx2.

Table I below illustrates additional simulation results for a SP4T CMOS switch using a body switching technique in multi-stacking transistor in accordance with an embodiment of the invention. As shown in Table I, the simulation results meet the demand of the high power handling capability at both bands (800-900 MHz and 1800-1900 MHz). For instance, the switched resonator provided by a receiver switch 200 at a the receive (Rx) path, in conjunction with the stacked transistors provided by the transmit switch 201, may provide high isolation at Tx mode from the antenna 100 to Rx, which can protect receiver circuit components such as LNAs from high power Tx signals. In addition, when a first receive path Rx1 mode is in operation, isolation between Rx1 and Rx2 may also high enough to prevent a signal from one path (e.g., Rx2) from leaking to the other path (e.g., Rx1).

TABLE I

|    |                    | Frequency   |              |
| -- | ------------------ | ----------- | ------------ |
|    |                    | 800-900 MHz | 1800-1900 MHz |
| TX | IL                 | −1.1 dB     | −1.2 dB      |
|    | P1dB               | 31.5 dBm    | 31.5 dBm     |
|    | Isolation Ant to RX | −55 dB      | −45 dB       |
| RX | IL                 | −1 dB       | −1.5 dB      |
|    | Isolation Rx1 to Rx2 | −32 dB    | −27 dB       |
|    | Isolation Ant to TX | −25 dB     | −20 dB       |

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A CMOS antenna switch, comprising:
    a transmit switch in communication with an antenna operative at a plurality of radio frequency (RF) bands;
    a receiver switch in communication with the antenna, wherein the receiver switch comprises a plurality of stacked transistors to provide a receive signal path, the plurality of stacked transistors including a first transistor having a body substrate; and
    at least one body switch, wherein the at least one body switch is configured to selectively connect the body substrate to either a resistance or ground,
    wherein when the transmit switch is enabled, the at least one body switch connects the body substrate of the first transistor to ground, thereby reducing leakage current in the receive signal path,
    wherein when the receiver switch is enabled, the at least one body switch connects the body substrate of the first transistor to the resistance, thereby reducing an insertion loss of the receive signal path.

2. The antenna switch of claim 1, wherein the at least one body switch comprises a body switching transistor.

3. The antenna switch of claim 2, wherein the body switching transistor includes a source and a drain, wherein the source is electrically connected to the body substrate of the first transistor and the drain is connected to ground.

4. The antenna switch of claim 1, wherein the plurality of transistors includes a second transistor having a second body substrate, and further comprising:
    at least one second body switch, wherein the at least one body switch is configured to selectively connect the second body substrate to either a second resistance or ground,
    wherein the first transistor is provided for controlling, at least in part, a first receive signal path of the receiver switch, and wherein the second transistor is provided for controlling, at least in part, a second receive signal path of the receiver switch.

5. The antenna switch of claim 1, wherein:
    during a transmit (Tx) mode, the transmit switch is enabled, the receiver switch is disabled, and the at least one body switch is enabled to connect the body substrate of the first transistor to ground; and
    during a receive (Rx) mode, the transmit switch is disabled, the receiver switch is enabled, and the at least one body switch is disabled to provide the resistance between the body substrate of the first transistor and ground.

6. The antenna switch of claim 5, wherein during the transmit (Tx) mode, the receiver switch is disabled at least in part by connecting at least one receive signal path of the receiver switch to ground.

7. The antenna switch of claim 1, wherein the first transistor further includes a first source and a first drain, wherein the plurality of stacked transistors includes a second transistor having a second source and a second drain, wherein the first and second transistors are cascaded by electrically connecting the second drain to the first source.

8. The antenna switch of claim 1, wherein the plurality of stacked transistors is a first plurality of transistors, and wherein the transmit switch includes a second plurality of stacked transistors, wherein at least a portion of the second plurality of stacked transistors are cascaded together.

9. The antenna switch of claim 8, wherein the second plurality of transistors comprise body floating transistors.

10. A method for providing a CMOS antenna switch, comprising:
    providing an antenna operative at a plurality of radio frequency (RF) bands;
    electrically connecting a transmit switch to the antenna;
    electrically connecting a receiver switch to the antenna, wherein the receiver switch comprises a plurality of stacked transistors to provide a receive signal path, the plurality of stacked transistors including a first transistor having a body substrate; and
    providing at least one body switch, wherein the at least one body switch is configured to selectively connect the body substrate to either a resistance or ground,
    wherein when the transmit switch is enabled, the at least one body switch connects the body substrate of the first transistor to ground, thereby reducing leakage current in the receive signal path,
    wherein when the receiver switch is enabled, the at least one body switch connects the body substrate of the first transistor to the resistance, thereby reducing an insertion loss of the receive signal path.

11. The method of claim 10, wherein the at least one body switch comprises a body switching transistor.

12. The method of claim 11, wherein the body switching transistor includes a source and a drain, wherein the source is electrically connected to the body substrate of the first transistor and the drain is connected to ground.

13. The method of claim 10, wherein the plurality of transistors includes a second transistor having a second body substrate, and further comprising:
providing at least one second body switch, wherein the at least one body switch is configured to selectively connect the second body substrate to either a second resistance or ground,
wherein the first transistor is provided for controlling, at least in part, a first receive signal path of the receiver switch, and wherein the second transistor is provided for controlling, at least in part, a second receive signal path of the receiver switch.

14. The method of claim 10, wherein:
during a transmit (Tx) mode, the transmit switch is enabled, the receiver switch is disabled, and the at least one body switch is enabled to connect the body substrate of the first transistor to ground; and
during a receive (Rx) mode, the transmit switch is disabled, the receiver switch is enabled, and the at least one body switch is disabled to provide the resistance between the body substrate of the first transistor and ground.

15. The method of claim 14, wherein during the transmit (Tx) mode, the receiver switch is disabled at least in part by connecting at least one receive signal path of the receiver switch to ground.

16. The method of claim 10, wherein the first transistor further includes a first source and a first drain, wherein the plurality of stacked transistors includes a second transistor having a second source and a second drain, wherein the first and second transistors are cascaded by electrically connecting the second drain to the first source.

17. The method of claim 10, wherein the plurality of transistors is a first plurality of stacked transistors, and wherein the transmit switch includes a second plurality of transistors, wherein at least a portion of the second plurality of stacked transistors are cascaded together.

18. The method of claim 17, wherein the second plurality of transistors comprise body floating transistors.

* * * * *